United States Patent
Wang

(10) Patent No.: US 7,078,798 B2
(45) Date of Patent: Jul. 18, 2006

(54) SEMICONDUCTOR PACKAGE AND MANUFACTURING METHOD THEREOF

(75) Inventor: Wu-Chang Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 68 days.

(21) Appl. No.: 10/463,572

(22) Filed: Jun. 18, 2003

(65) Prior Publication Data
US 2003/0234445 A1  Dec. 25, 2003

(30) Foreign Application Priority Data
Jun. 20, 2002  (TW)  ................ 91113534 A

(51) Int. Cl.
H01L 23/48   (2006.01)
H01L 23/52   (2006.01)

(52) U.S. Cl. .............. 257/692; 257/693; 257/696
(58) Field of Classification Search ........ 257/666–668, 257/669, 670, 671–677, 690, 692–693, 694, 257/695, 696, 724; 438/107, 110, 111, 123–124, 438/127
See application file for complete search history.

(56) References Cited

U.S. PATENT DOCUMENTS

| | | | | |
|---|---|---|---|---|
| 5,157,480 A | * | 10/1992 | McShane et al. | 257/693 |
| 5,436,500 A | * | 7/1995 | Park et al. | 257/696 |
| 6,177,726 B1 | * | 1/2001 | Manteghi | 257/725 |
| 6,198,163 B1 | * | 3/2001 | Crowley et al. | 257/706 |
| 6,271,581 B1 | * | 8/2001 | Huang et al. | 257/666 |
| 6,340,793 B1 | * | 1/2002 | Yaguchi et al. | 174/52.4 |
| 6,455,348 B1 | * | 9/2002 | Yamaguchi | 438/106 |
| 6,455,356 B1 | * | 9/2002 | Glenn et al. | 438/123 |
| 6,488,633 B1 | * | 12/2002 | Schnall | 600/481 |
| 6,605,866 B1 | * | 8/2003 | Crowley et al. | 257/692 |
| 6,740,541 B1 | * | 5/2004 | Rajeev | 438/109 |

* cited by examiner

Primary Examiner—Thien F. Tran
(74) Attorney, Agent, or Firm—Bacon & Thomas, PLLC

(57) ABSTRACT

A manufacturing method of a semiconductor package includes the following steps of: Providing a lead frame including a plurality of leads, each of the leads having an outer lead portion, an inner lead portion and a terminal. Forming a first insulation layer on the inner lead portions and terminals. Forming a die pad on the first insulation layer. Attaching a semiconductor die to the die pad. Forming a plurality of wires for bonding pads of the semiconductor die to corresponding outer lead portions. Finally, forming a molding compound for encapsulating the lead frame, first insulation layer, die pad, semiconductor die, and wires. Furthermore, this invention also discloses a semiconductor device manufactured by utilizing the method.

12 Claims, 6 Drawing Sheets

SEMICONDUCTOR PACKAGE AND MANUFACTURING METHOD THEREOF

BACKGROUND OF THE INVENTION

1. Field of Invention

This invention relates to a semiconductor package and manufacturing method thereof and, in particular, to a semiconductor package of wafer level chip size packages (CSP) and manufacturing method thereof.

2. Related Art

The high integration of ICs combined with the urgent consumption requirements of the market has resulted in a trend toward more compact and lightweight semiconductor packages. Currently there are a variety of semiconductor package technologies, which are disclosed. Widely used packages include Pin Grid Array (PGA) packages, Ball Grid Array (BGA) packages, wafer level CSPs, and the likes.

In the mentioned packages, since the surface of a BGA type semiconductor package 1 (as shown in FIG. 1) is efficiently employed, the BGA type semiconductor package 1 has more solder balls 13 provided on the surface of the substrate 11. Therefore, the solder balls 13 are able to make an electrical connection to the pads (not shown) on the semiconductor die 12 via trace lines and fingers provided by the BGA type semiconductor package 1. In the BGA type semiconductor package 1, more fingers are used, so that the semiconductor die 12 and outwards could communicate to each other via the solder balls 13.

Compared to the BGA type semiconductor package 1, a wafer level CSP type semiconductor package employs a smaller substrate with fewer leads formed around the semiconductor die. Put simply, the amount of leads available in wafer level CSP type semiconductor packages is limited.

For example, wafer level CSP type semiconductor packages usually include Quad Flat No-Lead (QFN) type semiconductor packages and Bump Chip Carrier (BCC) type semiconductor packages. In such cases, the lead frame has a bottom surface for electrically connecting with a mother board, making extra conductive components, such as trace lines and fingers, unnecessary. Thus, the objective of minimizing semiconductor packages can be carried out. In general, wafer level CSP type semiconductor packages are compact and light, so they are often used in electronic devices such as personal computers, digital cameras, and mobile phones.

Please refer to FIGS. 2A and 2B, for a representation of a conventional QFN type semiconductor package 2, which includes a die pad 21, a semiconductor die 22, a lead frame 23, a plurality of wires 24, and a molding compound 25. In this case, the semiconductor die 22 is attached to the die pad 21. The semiconductor die 22 and lead frame 23 respectively have a plurality of pads 221 and leads 231, and each of the wires 24 is used to bond each pad 221 to each corresponding lead 231. The molding compound 25 covers the die pad 21, semiconductor die 22, lead frame 23, and wires 24. It should be noted that the molding compound 25 does not cover the bottom surfaces of the die pad 21 and lead frame 23. Therefore, the QFN type semiconductor package 2 is able to make an electrical connection with the mother board (not shown) via the bottom surface of the lead frame 23.

As mentioned above, the molding compound 25 is made of thermosetting material, which can be cured under high temperature. Each of the leads 231 has a surface coated with a metallic material such as tin or Ni—Pd alloys for electrically connecting with one of the wires 24. Therefore, the welding qualities between the wires 24 and leads 231 are improved, and the chemical reactions between the wires 24 and leads 231 can be prevented.

The conventional die pad 21, however, is a single layer structure and is only used for carrying the semiconductor die 22. Thus, there is no lead provided on the bottom surface of die pad 21. Put simply, the QFN type semiconductor package 2 cannot have as many solder balls as the BGA type semiconductor package 1 (as shown in FIG. 1). Furthermore, people skilled in the art should known that any other wafer level CSP type semiconductor package, such as a BCC type semiconductor package, will also not have as many solder balls as the BGA type semiconductor package 1.

Hence, to increase leads during performing wafer level CSP packaging, it is necessary to enlarge the size of a wafer level CSP type semiconductor package. However, once the size is enlarged, the semiconductor package is unsuitable for the compact electronic devices, for which the wafer level CSP is commonly used. Alternatively, people skilled in the art might reduce the pitches between the leads to solve the above-mentioned problem, but this will decrease the yield of semiconductor packages while performing SMT processes.

It should also be noted that although the BGA type semiconductor package provides more leads, the cost of a BGA type semiconductor package is relatively higher than that of a wafer level CSP type semiconductor package.

Therefore, it is an important subjective of the invention to increase the number of leads without enlarging the size of a semiconductor package, and to improve the yield while manufacturing semiconductor packages.

SUMMARY OF THE INVENTION

In view of the above-mentioned problems, an objective of the invention is to provide a semiconductor package, which has increased leads and improved yield, and a manufacturing method of the semiconductor package.

To achieve the above-mentioned objective, a manufacturing method of a semiconductor package of the invention includes: providing a lead frame having a plurality of leads; forming a first insulation layer on inner lead portions and terminals of the leads; forming a die pad on the first insulation layer; attaching a semiconductor die to the die pad; forming a plurality of wires for bonding pads of the semiconductor die to outer lead portions of the leads; and forming a molding compound for encapsulating the lead frame, first insulation layer, die pad, semiconductor die, and wires.

Furthermore, this invention also discloses a semiconductor package, which is manufactured with the mentioned method. The semiconductor package includes a lead frame, a first insulation layer, a die pad, a semiconductor die, a plurality of wires, and a molding compound. In this invention, the lead frame has a plurality of leads, each of which includes an outer lead portion, an inner lead portion, and a terminal. The first insulation layer is formed on the inner lead portions and terminals, and the die pad is further formed on the insulation layer. The semiconductor die is attached to the die pad and has a plurality of pads for electrically connecting to the outer lead portions through the wires. The molding compound encapsulates the lead frame, first insulation layer, die pad, semiconductor die, and wires.

As mentioned above, since the semiconductor package and manufacturing method thereof according to the invention provide terminals under the die pad for electrically connecting to the mother board, the I/O terminals of this semiconductor package are similar to those of a BGA type semiconductor package. Therefore, in the manufacturing processes of the semiconductor package of the invention such as QFN or BCC type semiconductor package, the number of leads can be increased without enlarging the semiconductor package, and the yield can be improved while manufacturing the semiconductor package of the invention.

BRIEF DESCRIPTION OF THE DRAWINGS

The invention will become more fully understood from the detailed description given herein below illustration only, and thus are not limitative of the present invention, and wherein:

FIG. 4E is a schematic illustration showing the semiconductor package according to the preferred embodiment of the.

DETAILED DESCRIPTION OF THE INVENTION

The semiconductor package and manufacturing method thereof according to the preferred embodiment of the invention will be described herein below with reference to the accompany drawings, wherein the same reference numbers refer to the same elements.

Figure 1:
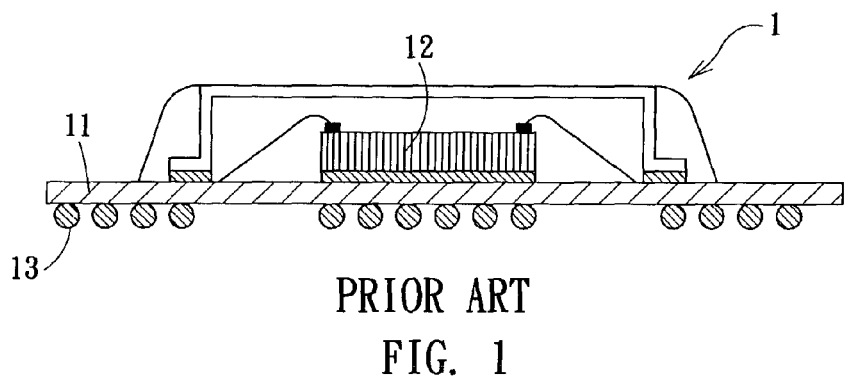
FIG. 1 is a schematic illustration showing a conventional BGA type semiconductor package.
Figure 2A:
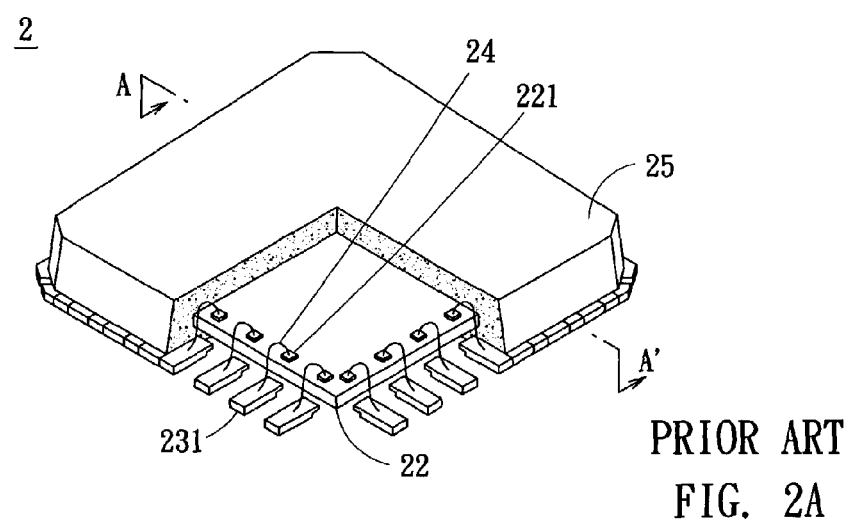
FIG. 2A is a schematic illustration showing a conventional QFN type semiconductor package.
Figure 2B:
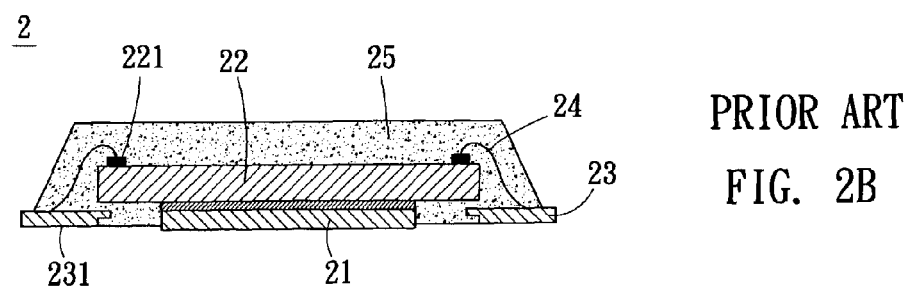
FIG. 2B is a schematic illustration showing a cross sectional view along line AA' of the QFN type semiconductor package shown in FIG. 2A.
Figure 3:
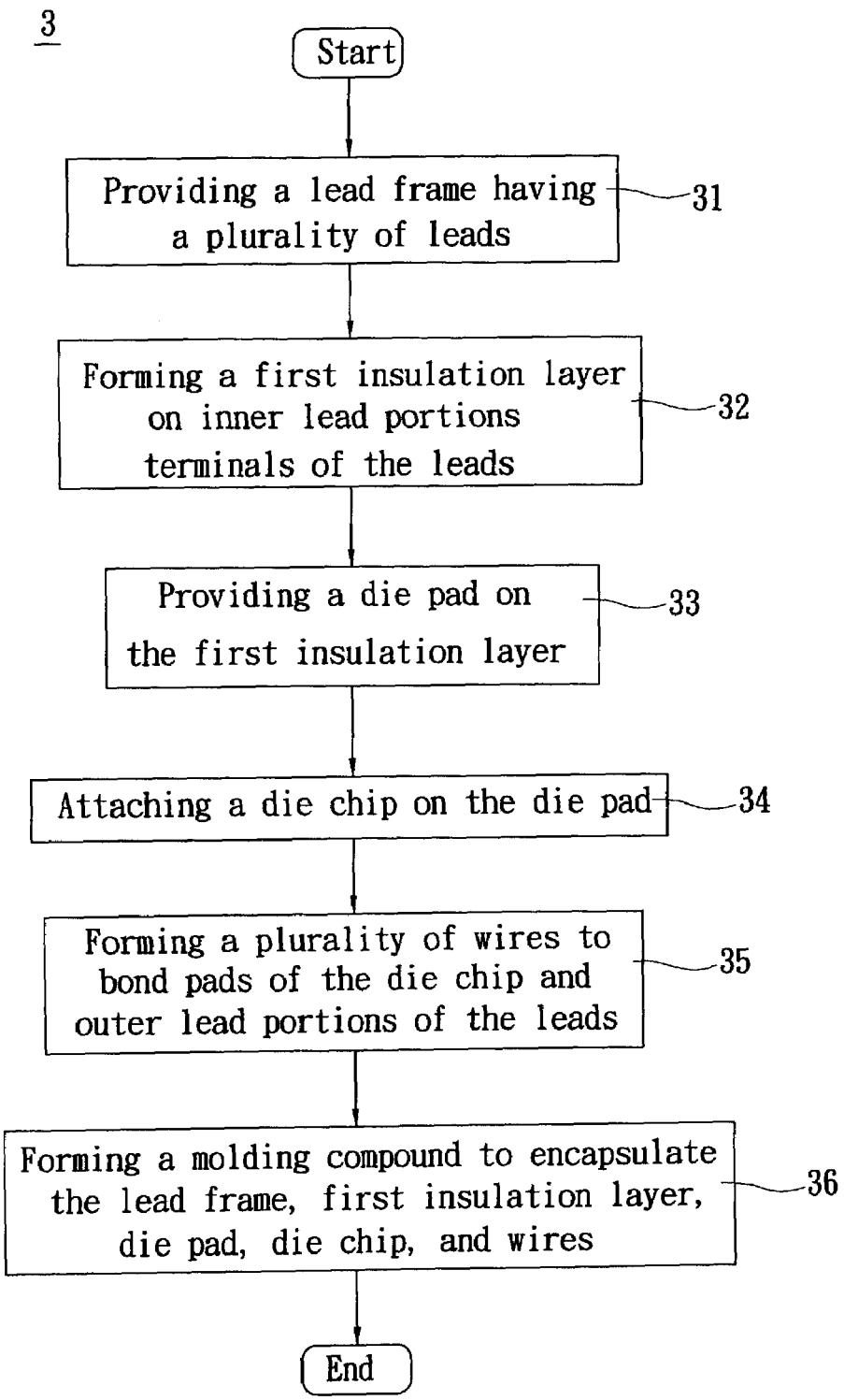
FIG. 3 is a flow chart having the procedure of a manufacturing method of a semiconductor package according to a preferred embodiment of the invention.

Please refer to FIG. 3. A manufacturing method 3 of a semiconductor package includes the following steps:

First, step 31 provides a lead frame having a plurality of leads. In the present embodiment, each of the leads has an outer lead portion, an inner lead portion, and a terminal, respectively.

Next, in step 32, a first insulation layer is formed on the leads so as to cover the inner lead portion and terminal of each lead.

After that, a die pad is provided on the first insulation layer (step 33), a semiconductor die is attached to the die pad (step 34), a plurality of wires are formed to bond the pads of the semiconductor die to the outer lead portions (step 35), and a molding compound is formed (step 36). In this embodiment, the molding compound encapsulates the lead frame, first insulation layer, die pad, semiconductor die, and wires, wherein the terminals of the lead frame are exposed and protrude from the molding compound.

People skilled in the art should know that the previously mentioned steps, 33~36, can be performed by executing conventional semiconductor packaging processes, for example, a die attaching process, a wire bonding process, a molding process, and the likes.

Furthermore, the manufacturing method 3 of a semiconductor package further forms a second insulation layer on the bottom of the lead frame. The second insulation layer is used to cover the inner lead portions, so that a short circuit of the inner lead portions can be prevented. In the present embodiment, each terminal is exposed and protrudes from the second insulation layer, so the terminals can contact and electrically connect to a mother board while the semiconductor package is mounted on the mother board.

A semiconductor package of the current invention manufactured by utilizing the mentioned method is described in greater detail with reference to the following embodiment.

With reference to FIGS. 4A through 4E, a semiconductor package 4 according to another preferred embodiment of the invention includes a lead frame 41, a first insulation layer 42, a die pad 43, a semiconductor die 44, a plurality of wires 45, and a molding compound 46.

Figure 4A:
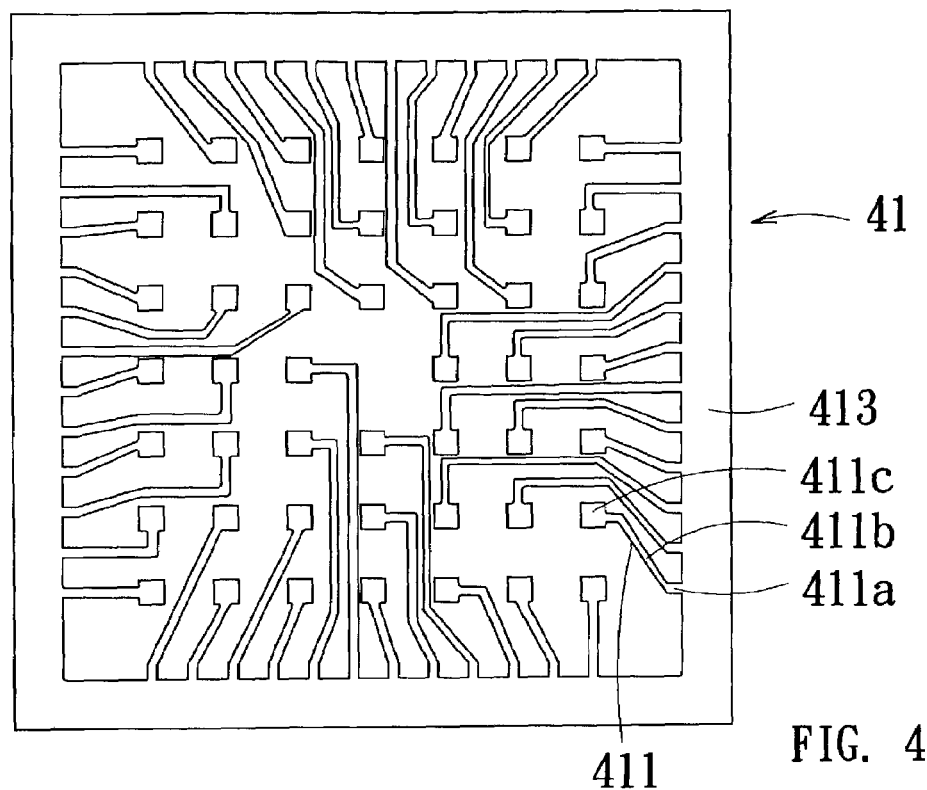
FIG. 4A is a schematic illustration showing a lead frame of the semiconductor package according to another preferred embodiment of the invention.

As shown in FIG. 4A, the lead frame 41 has a plurality of leads 411, wherein each lead 411 has an outer lead portion 411a, an inner lead portion 411b, and a terminal 411c. In the current embodiment, each outer lead portion 411a is mounted to a first frame 413, and each inner lead portion 411b is extended from each corresponding outer lead portion 411a to the center of the first frame 413 inwardly. The terminals 411c are provided in the center of the first frame 413 and are connected to the corresponding inner lead portions 411b. It should be noted that the arrangement of the mentioned outer lead portions 411a, inner lead portions 411b and terminals 411c is designed based on the specifications of semiconductor package 4.

Figure 4B:
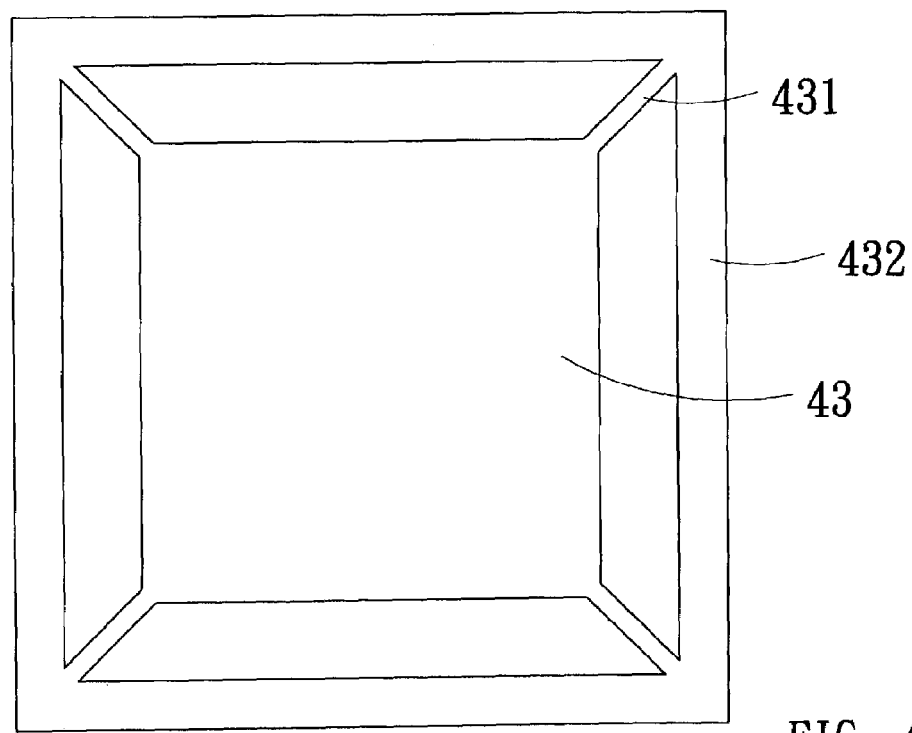
FIG. 4B is a schematic illustration showing a die pad of the semiconductor package according to the preferred embodiment of the invention.
Figure 4C:
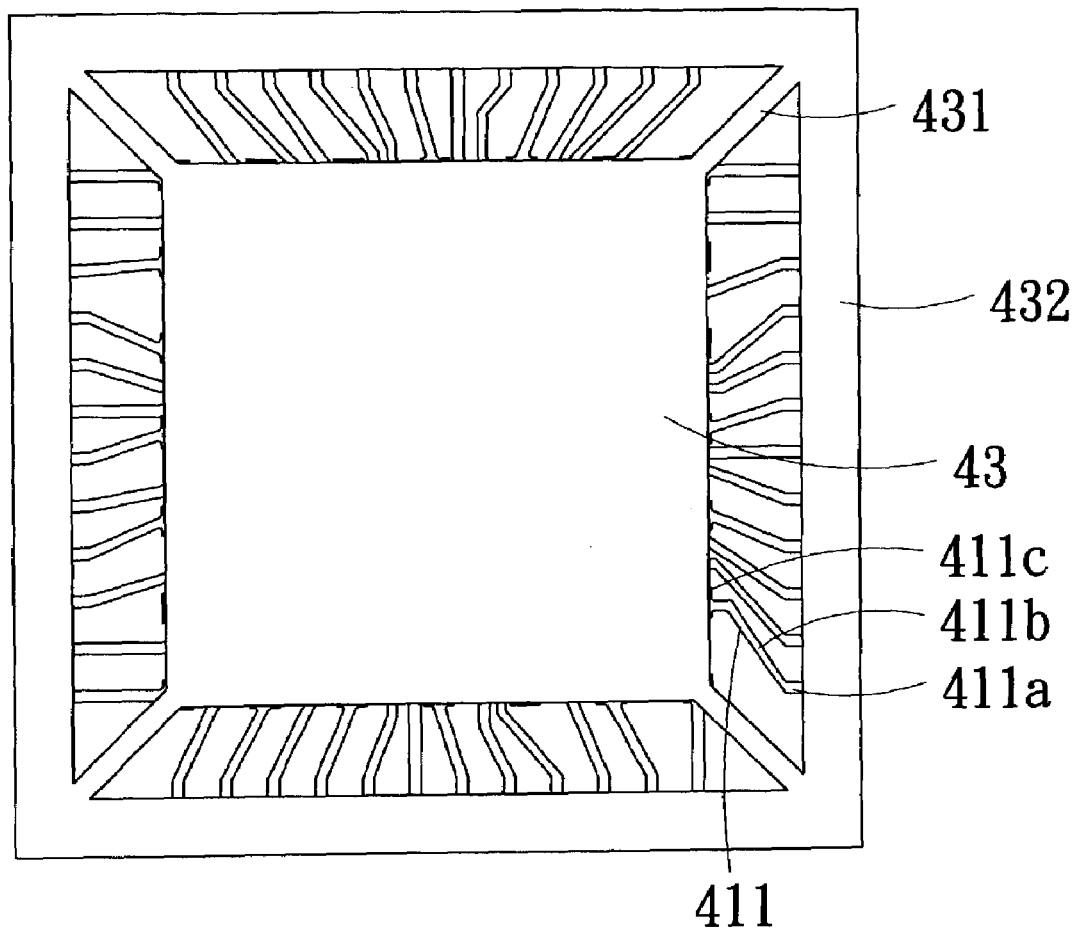
FIG. 4C is a schematic illustration showing the lead frame and die pad of the semiconductor package according to the preferred embodiment of the invention.
Figure 4D:
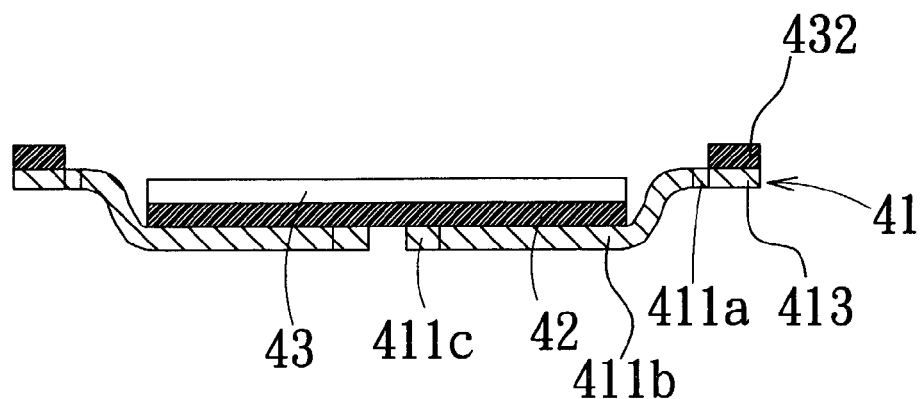
FIG. 4D is a schematic illustration showing the lead frame, a first insulation layer, and the die pad of the semiconductor package according to the preferred embodiment of the invention.

Referring to FIGS. 4C and 4D, the first insulation layer 42 is formed on the inner lead portions 411b and terminals 411c, and the die pad 43 is formed on the first insulation layer 42. The first insulation layer 42 is located in the center of the first frame 413 (as shown in FIG. 4A). Each corner of the die pad 43 is mounted on the second frame 432 (as shown in FIG. 4B) with a tie bar 431. Thus, when the die pad 43 is provided on the first insulation layer 42, the second frame 431 is placed on the first frame 413. In the invention, the first insulation layer 42 can be made of any insulation material. Moreover, the lead frame 41 may have a concave formed at the center of the lead frame 41. In this structure, the die pad 43 can be positioned in the concave (as shown in FIG. 4D).

In addition, the semiconductor die 44 is attached to the die pad 43. People skilled in the art should know that the semiconductor die 44 has a plurality of pads 441. In this case, the die pad 43, semiconductor die 44, and the manufacturing processes thereof are familiar to those skilled in the art, so there is no further related illustration herein.

Figure 4E:
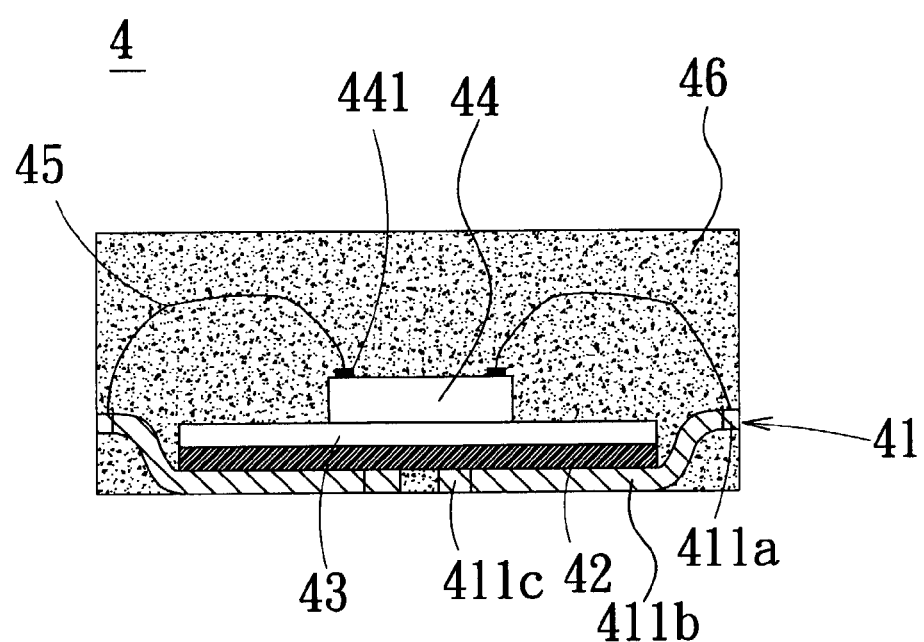

With reference to FIG. 4E, each of the wires 45 bonds to each pad 441 and to the corresponding outer lead portion 411a. In the current embodiment, the bonding can be performed by utilizing the conventional wire bonding process.

Please refer to FIG. 4E again, the semiconductor package 4 further includes a molding compound 46, which encapsulates the lead frame 41, first insulation layer 42, die pad 43, semiconductor die 44, and wires 45. In the invention, the terminals 411c of lead frame 41 are exposed and protrude from the molding compound 46. In succession, the first frame 413 and second frame 432 (as shown in FIG. 4D) might be cut off in a formation process after the molding process. Therefore, the semiconductor package 4 as shown in FIG. 4E is obtained.

Figure 5:
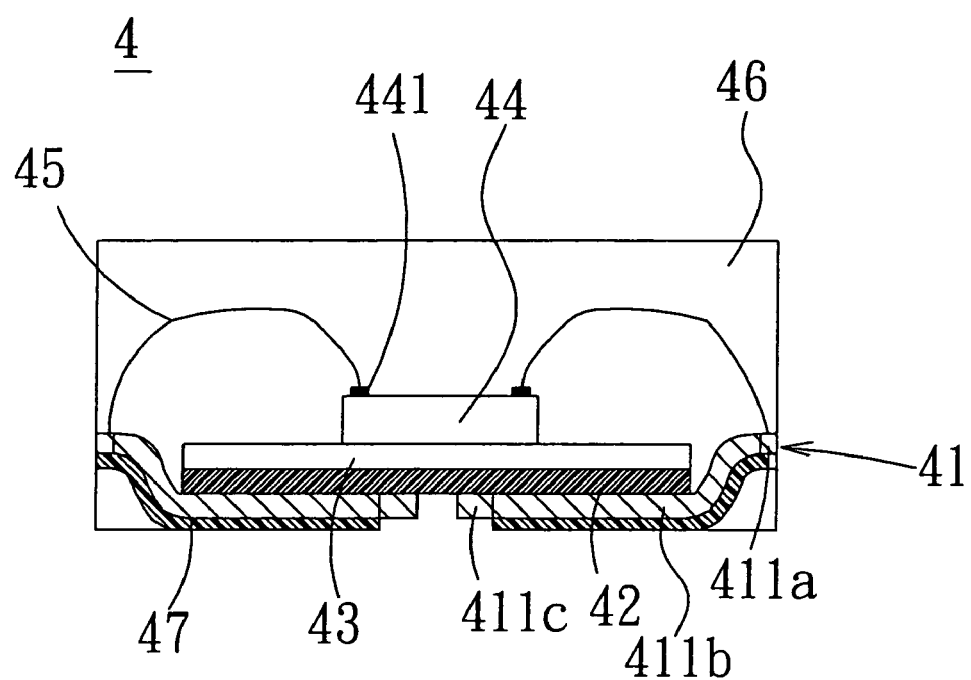
FIG. 5 is a schematic illustration of another embodiment showing a second insulation layer.

It should be noted that the semiconductor package 4 might be further provided on a mother board (not shown). In this case, the terminals 411c connect to the mother board while the outer lead portions 411a and inner lead portions 411b do not connect to the mother board. Moreover, in yet another embodiment of the invention, a second insulation layer 47 (as shown in FIG. 5) is formed on the bottom of the lead 411. The outer lead portions 411a and inner lead portions 411b are covered with the second insulation layer 47, and the terminals 411c are exposed. As a result, the outer lead portions 411a and inner lead portions 411b are electrically insulated from the mother board, and the terminals 411c are electrically connected to the mother board. As mentioned above, the pitches between the outer lead portions 411a can be minimized. For instance, the pitch between adjacent outer lead portions 411a can be 0.15~0.2 mm, and the pitch between adjacent terminals 411c can be 0.4~0.5 mm. In the later package processes, since the outer lead portions 411a do not connect to the mother board, the short circuit issue would be prevented during later SMT processes even if the pitches between the outer lead portions 411a are minimized. Alternatively, the pitches between the terminals 411c are big enough to prevent a short circuit while connecting to the mother board.

In the present embodiment, the semiconductor package 4 is a QFN type semiconductor package. It should be noted that a semiconductor package of the invention could also be a BCC type semiconductor package, or any other wafer level chip size package.

Since the semiconductor package and manufacturing method thereof of the invention provide the terminals 411c formed on the bottom of the die pad 43, the I/O terminals of the semiconductor package of the invention are similar to those of a BGA type semiconductor package. Thus, the amount of outer lead portions 411a can be increased. Furthermore, since the outer lead portions 411a do not make a direct electrical connection to the mother board, the pitches between the outer lead portions 411a can be minimized efficiently without causing a short circuit. In summary, the semiconductor package of the invention has increased the number of leads without enlarging the semiconductor package, and the yield can be improved while manufacturing the semiconductor package of the invention.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A manufacturing method of a semiconductor package, comprising:
    providing a lead frame having a plurality of leads, each of the leads having an outer lead portion, an inner lead portion and a terminal;
    forming a first insulation layer on the inner lead portions and the terminals;
    providing a die pad on the first insulation layer;
    attaching a semiconductor die to the die pad;
    forming a plurality of wires for bonding a plurality of pads of the semiconductor die to the outer lead portions, respectively;
    forming a molding compound to encapsulate the lead frame, the first insulation layer, the die pad, the semiconductor die, and the wires; and
    forming a second insulation layer under the leads and directly contacting the leads, wherein the terminals of the leads are exposed.

2. The manufacturing method of claim 1, wherein the terminals of the lead frame are exposed and protrude from the molding compound.

3. The manufacturing method of claim 1, wherein the lead frame has a concave formed at the center of the lead frame, and the die pad and the semiconductor die are located in the concave.

4. The manufacturing method of claim 1, wherein the terminals of the leads are used for electrically connecting to a mother board.

5. The manufacturing method of claim 1, wherein the semiconductor package is a wafer level chip size package.

6. The manufacturing method of claim 1, wherein the first insulation layer formed on the inner lead portions and the terminals is a single uniform insulation layer.

7. A semiconductor package, comprising:
    a lead frame having a plurality of leads, each of the leads having an outer lead portion, an inner lead portion, and a terminal;
    a first insulation layer formed on the inner lead portions and the terminals;
    a die pad formed on the first insulation layer;
    a semiconductor die attached to the die pad;
    a plurality of wires for bonding a plurality of pads of the semiconductor die to the outer lead portions, respectively;
    a molding compound for encapsulating the lead frame, the first insulation layer, the die pad, the semiconductor die, and the wires; and
    a second insulation layer formed on the bottom of the leads and directly contacting the leads, wherein the terminals of the leads are exposed.

8. The semiconductor package of claim 7, the terminals of the lead frame are exposed and protrude from the molding compound.

9. The semiconductor package of claim 7, wherein the lead frame has a concave formed at the center of the lead frame, and the die pad and the semiconductor die are located in the concave.

10. The semiconductor package of claim 7, wherein the terminals of the leads are used for electrically connecting to a mother board.

11. The semiconductor package of claim 7, wherein the semiconductor package is a wafer level chip size package.

12. The semiconductor package of claim 7, wherein the first insulation layer formed on the inner lead portions and the terminals is a single uniform insulation layer.

* * * * *